(12) United States Patent
Oh et al.

(10) Patent No.: US 11,882,647 B2
(45) Date of Patent: *Jan. 23, 2024

(54) STRUCTURE FOR DELIVERING POWER

(71) Applicant: Rambus Inc., San Jose, CA (US)

(72) Inventors: Kyung Suk Oh, Cupertino, CA (US);
Ralf M. Schmitt, San Jose, CA (US);
Yijiong Feng, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 387 days.

This patent is subject to a terminal disclaimer.

(21) Appl. No.: 17/360,896

(22) Filed: Jun. 28, 2021

(65) Prior Publication Data

US 2021/0329774 A1    Oct. 21, 2021

Related U.S. Application Data

(63) Continuation of application No. 16/860,805, filed on Apr. 28, 2020, now Pat. No. 11,083,077, which is a
(Continued)

(51) Int. Cl.
*H05K 1/02*  (2006.01)
*H01L 23/498*  (2006.01)
(Continued)

(52) U.S. Cl.
CPC .............. *H05K 1/0216* (2013.01); *H01B 5/02* (2013.01); *H01L 23/49811* (2013.01);
(Continued)

(58) Field of Classification Search
CPC .. H05K 1/0216; H01B 5/02; H01L 23/49811; H01L 23/49838; H01L 23/5223
(Continued)

(56) References Cited

U.S. PATENT DOCUMENTS 5,229,639 A   7/1993  Hansent et al.
5,402,318 A   3/1995  Otsuka et al.
(Continued)

FOREIGN PATENT DOCUMENTS

WO   WO-2013-028404 A1   2/2013

OTHER PUBLICATIONS

PCT International Preliminary Report on Patentability dated Apr. 10, 2014 (Chapter I) in International Application No. PCT/US2012/050730. 8 pages.
(Continued)

*Primary Examiner* — Andargie M Aychillhum
(74) *Attorney, Agent, or Firm* — Park, Vaughan, Fleming & Dowler LLP; Laxman Sahasrabuddhe

(57) ABSTRACT

A structure for delivering power is described. In some embodiments, the structure can include conductors disposed on two or more layers. Specifically, the structure can include a first set of interdigitated conductors disposed on a first layer and oriented substantially along an expected direction of current flow. At least one conductor in the first set of interdigitated conductors may be maintained at a first voltage, and at least one conductor in the first set of interdigitated conductors may be maintained at a second voltage, wherein the second voltage is different from the first voltage. The structure may further include a conducting structure disposed on a second layer, wherein the second layer is different from the first layer, and wherein at least one conductor in the conducting structure is maintained at the first voltage.

20 Claims, 8 Drawing Sheets

Related U.S. Application Data continuation of application No. 15/888,231, filed on Feb. 5, 2018, now Pat. No. 10,674,597, which is a continuation of application No. 14/346,307, filed as application No. PCT/US2012/050730 on Aug. 14, 2012, now Pat. No. 9,913,363.

(60) Provisional application No. 61/540,687, filed on Sep. 29, 2011.

(51) Int. Cl.
    *H01L 23/528* (2006.01)
    *H01B 5/02* (2006.01)
    *H01L 23/522* (2006.01)

(52) U.S. Cl.
    CPC .... *H01L 23/49838* (2013.01); *H01L 23/5286* (2013.01); *H01L 23/5223* (2013.01); *H01L 2924/0002* (2013.01)

(58) Field of Classification Search
    USPC ........................................................ 361/780
    See application file for complete search history.

(56) References Cited

U.S. PATENT DOCUMENTS

| | | | |
|---|---|---|---|
| 5,986,893 A | 11/1999 | Leigh et al. | |
| 6,164,781 A | 12/2000 | Tsang et al. | |
| 6,335,494 B1 | 1/2002 | Gregor et al. | |
| 6,483,714 B1 | 11/2002 | Kabumoto et al. | |
| 6,522,034 B1 | 2/2003 | Nakayama | |
| 7,120,886 B2 | 10/2006 | Deleule | |
| 7,127,688 B2 | 10/2006 | Ling et al. | |
| 7,808,092 B2 | 10/2010 | Ho | |
| 8,166,331 B2 | 4/2012 | Zou | |
| 8,198,724 B1 | 6/2012 | Wu et al. | |
| 8,271,819 B2 | 9/2012 | Breen, III et al. | |
| 8,335,577 B2 | 12/2012 | Lin et al. | |
| 8,664,806 B2 | 3/2014 | Conil et al. | |
| 9,913,363 B2 | 3/2018 | Oh et al. | |
| 2003/0102550 A1 | 6/2003 | Mihara et al. | |
| 2003/0110452 A1 | 6/2003 | Leahy et al. | |
| 2004/0143805 A1 | 7/2004 | Deleule | |
| 2004/0188811 A1 | 9/2004 | Vandentop et al. | |
| 2005/0082675 A1 | 4/2005 | Salcido, Jr. et al. | |
| 2007/0297156 A1 | 12/2007 | Hosomi | |
| 2008/0079135 A1 | 4/2008 | Shah | |
| 2010/0223485 A1 | 9/2010 | Zou | |
| 2010/0250973 A1 | 9/2010 | Breen et al. | |
| 2010/0290202 A1 | 11/2010 | Sasaki et al. | |
| 2012/0025210 A1 | 2/2012 | Saeki et al. | |
| 2012/0218729 A1 | 8/2012 | Carey et al. | |
| 2013/0153284 A1 | 6/2013 | Pai | |
| 2017/0141029 A1* | 5/2017 | Guo | H01L 27/0207 |
| 2018/0075903 A1* | 3/2018 | Ogiwara | H10B 63/845 |

OTHER PUBLICATIONS

PCT International Search Report and Written Opinion dated Feb. 1, 2013 in International Application No. PCT/US2012/050730. 9 pages.

* cited by examiner

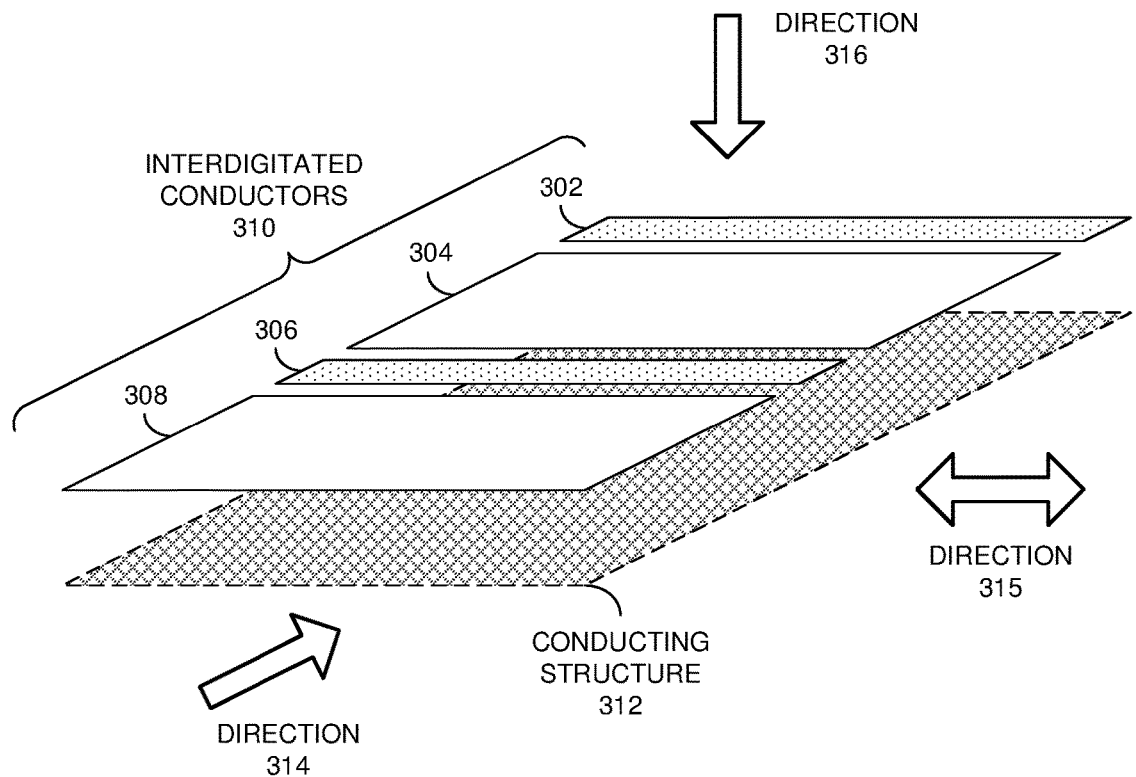
FIG. 3A
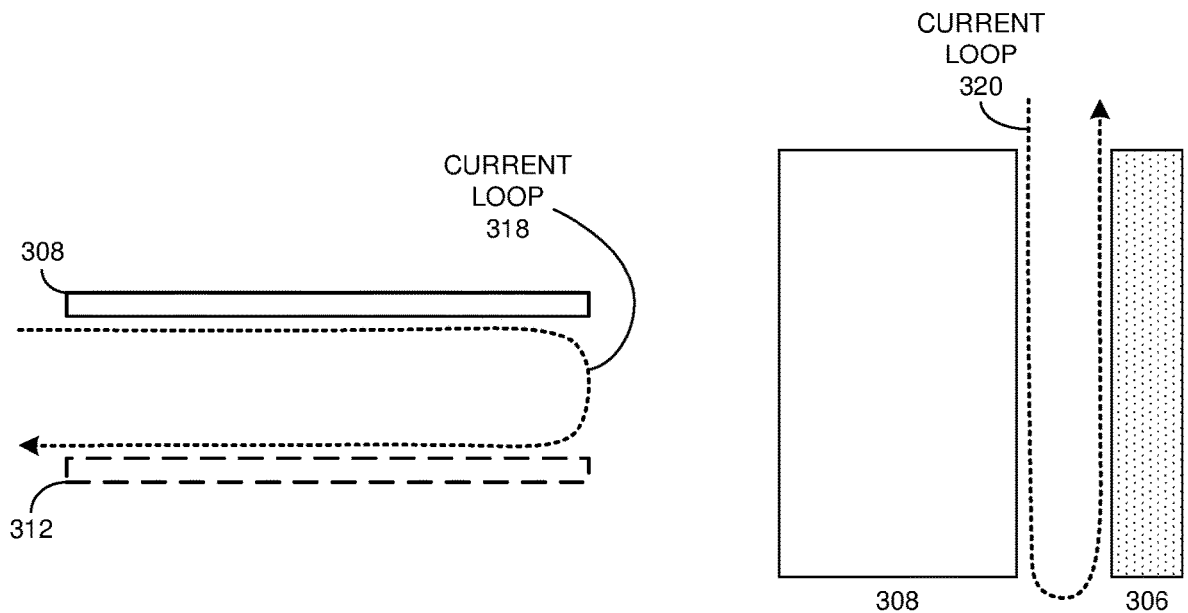
FIG. 3B
FIG. 3C

US 11,882,647 B2

STRUCTURE FOR DELIVERING POWER

RELATED APPLICATION

This application is a continuation of pending U.S. application Ser. No. 16/860,805, having the same title and inventors as the instant application, which was filed on 28 Apr. 2020, and which is herein incorporated by reference in its entirety for all purposes. U.S. application Ser. No. 16/860,805 is a continuation of Issued U.S. Pat. No. 10,674,597 having the same title and inventors as the instant application, which is herein incorporated by reference in its entirety for all purposes. U.S. Pat. No. 10,674,597 is a continuation of Issued U.S. Pat. No. 9,913,363, having the same title and inventors as the instant application, which is herein incorporated by reference in its entirety for all purposes. U.S. Pat. No. 9,913,363 is a U.S. National Stage Application under 35 U.S.C. § 371 of PCT Application No. PCT/US2012/050730, having the same title and inventors as the instant application, which was filed on 14 Aug. 2012, and which is herein incorporated by reference in its entirety for all purposes. PCT Application No. PCT/US2012/050730 claims priority under 35 U.S.C. § 119 to U.S. Provisional Patent Application No. 61/540,687, having the same title and inventors as the instant application, which was filed on 29 Sep. 2011, and which is herein incorporated by reference in its entirety for all purposes.

BACKGROUND

This disclosure generally relates to electronic circuits. A power distribution network can generally refer to circuitry and/or a structure that is used to deliver power, e.g., by delivering current between a first set of contacts and a second set of contacts. The inductance in the power distribution network is one factor to be considered in delivering reliable power with a specified target impedance. In an integrated circuit (IC) die, a contact in the first set of contacts may correspond to a terminal that is maintained at a given voltage (e.g., power supply voltage or ground), and a contact in the second set of contacts may correspond to a terminal of a circuit element. In an IC package, a contact in the first set of contacts may correspond to a power pin on the package, and a contact in the second set of contacts may correspond to a pad on the die. In a printed circuit board (PCB), a contact in the first set of contacts may correspond to a PCB contact for a power supply regulator, and a contact in the second set of contacts may correspond to a pin on an IC package.

If the total impedance of the power distribution network is high, then the power distribution network may introduce an unacceptably high amount of power noise.

FIG. 1 illustrates a structure for delivering power. Power delivery structure 102 can include conductor 104 whose left end is electrically connected to a power supply voltage and conductor 106 whose left end is electrically connected to ground. The current may flow along direction 108 (e.g., from left to right in conductor 104 and from right to left in conductor 106). The inductance (and therefore the impedance) of power delivery structure 102 may be unacceptably high, and may introduce an unacceptably high amount of power noise.

BRIEF DESCRIPTION OF THE FIGURES

FIG. 3A illustrates a structure for delivering power in accordance with some embodiments described in this disclosure.
FIG. 3B illustrates a front view of the structure shown in FIG. 3A in accordance with some embodiments described in this disclosure.
FIG. 3C illustrates a top view of the structure shown in FIG. 3A in accordance with some embodiments described in this disclosure.

DETAILED DESCRIPTION

Some embodiments presented in this disclosure feature a structure for delivering power that reduces power noise. Embodiments presented herein can generally be part of any power distribution network in which planes (or substantially planar conductors) are used for power delivery. Specifically, embodiments can be part of a power distribution network in an IC die, an IC package, or a printed circuit board.

Figure 2A:
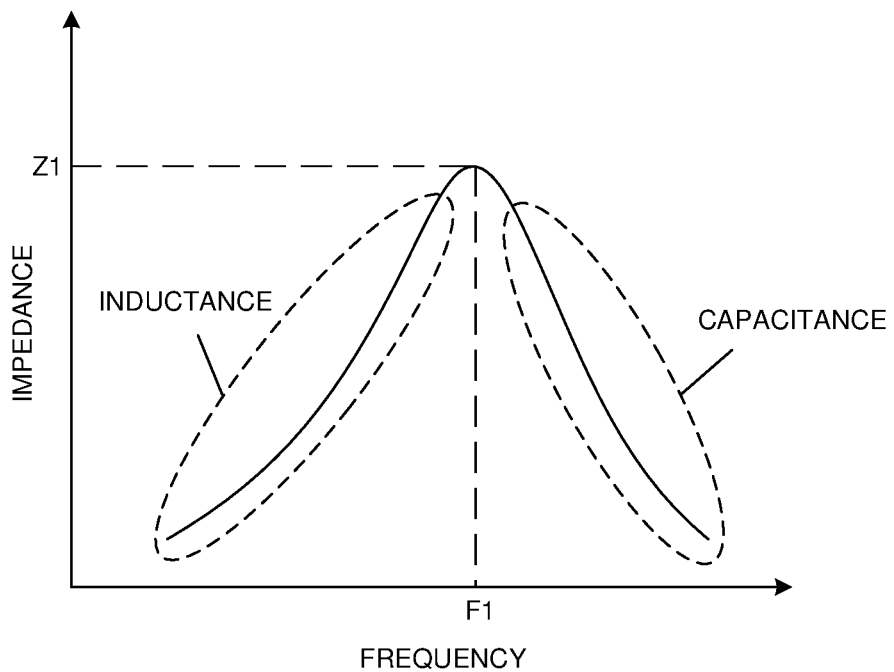
FIGS. 2A and 2B illustrate plots of the impedance of a power distribution network versus frequency in accordance with some embodiments described in this disclosure.
Figure 2B:
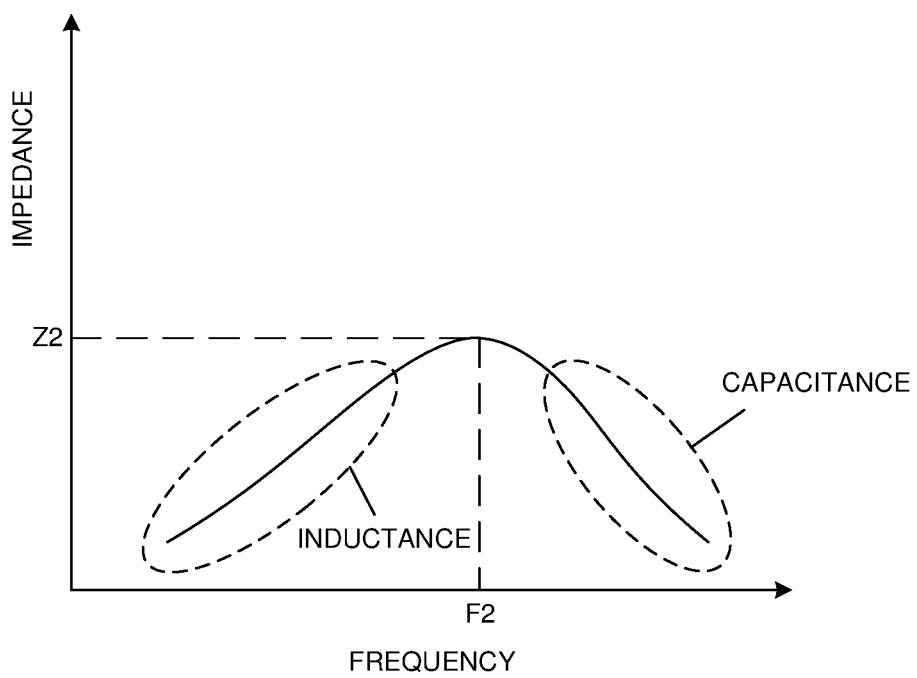

FIGS. 2A and 2B illustrate plots of the impedance of a power distribution network versus frequency in accordance with some embodiments described in this disclosure.

In some embodiments described herein, the impedance of a power distribution network can be modeled using one or more resistances, inductances, and/or capacitances. In these embodiments, as the frequency increases, the contribution of the one or more inductances to the total impedance increases, while the contribution of the one or more capacitances to the total impedance decreases.

If the total impedance of the power distribution network is high for a particular frequency range, then the power distribution network may introduce an unacceptably high amount of power noise in that frequency range. For example, as shown in FIG. 2A, the impedance of the power distribution network at frequency F1 is Z1. If the value of Z1 is sufficiently high, then the power distribution network may introduce an unacceptably high amount power noise with frequencies around F1.

Some embodiments described herein decrease the impedance of the power distribution network, thereby decreasing the amount of power noise introduced by the power distribution network. For example, as shown in FIG. 2B, reducing the inductance of the power distribution network decreases the overall impedance of the power distribution network. Specifically, the peak impedance value Z2 shown in FIG. 2B is lower than the peak impedance value Z1 shown in FIG. 2A.

Some embodiments described herein provide a structure for delivering power that has a low inductance, which causes the impedance of the power distribution network to be low, which, in turn, causes the amount of power noise introduced by the power distribution network to be low.

FIG. 3A illustrates a structure for delivering power in accordance with some embodiments described in this disclosure.

Some embodiments can comprise conductors disposed on two or more layers. Specifically, in some embodiments, a structure for delivering power can comprise interdigitated conductors 310 disposed on a first layer, and conducting structure 312 disposed on a second layer.

As shown in FIG. 3A, interdigitated conductors 310 can include conductors 302-308. At least one conductor (e.g., conductors 302 and 306) in interdigitated conductors 310 can be maintained at voltage V1, and at least one conductor (e.g., conductors 304 and 308) in interdigitated conductors 310 can be maintained at voltage V2, wherein voltage V1 is different from voltage V2.

In general, voltages V1 and V2 can be any voltages that can be used to provide power to a circuit. Specifically, in some embodiments, voltage V1 can be ground and voltage V2 can be a power supply voltage. In other embodiments, voltage V1 can be a power supply voltage and voltage V2 can be ground.

Conducting structure 312 can include one or more conductors. In some embodiments, at least one conductor in conducting structure 312 can be maintained at voltage V1. In other embodiments, at least one conductor in conducting structure 312 can be maintained at voltage V2.

In some embodiments, the orientation of the conductors can be substantially along the expected direction of current flow. For example, in FIG. 3A, the current is expected to flow along direction 315, and therefore, interdigitated conductors 310 are substantially oriented along direction 315. In some embodiments, the shape of the conductors can be based on the pattern of current flow. For example, if the die dimension is smaller than package size, the conductors may have a tapered shape, e.g., a trapezoidal shape. The shapes and/or sizes of the conductors can be selected to ensure that the DC (direct current) resistance of the power delivery structure has a negligible impact on the operation of the circuit to which power is being delivered.

In some embodiments described herein, the inductance associated with a current loop depends on the cross-sectional area of the current loop, and the width of the current loop along a direction that is orthogonal to the plane of the current loop. If the distance between a power supply conductor and a ground conductor is large, it can cause the cross-sectional area of the current loop to be large, which, in turn, can cause the inductance of the power distribution network to be high.

FIGS. 3B-3C described below explain why the inductance of the structure shown in FIG. 3A is low.

FIG. 3B illustrates a front view (i.e., a view along direction 314) of the structure shown in FIG. 3A in accordance with some embodiments described in this disclosure.

Current loop 318 is formed by a current that flows between a first set of contacts and a second set of contacts via conductor 308 and conducting structure 312. For example, the first set of contacts may be electrically connected to the left ends of conductor 308 and conducting structure 312, and the second set of contacts may be electrically connected to the right ends of conductor 308 and conducting structure 312. The inductance due to current loop 318 can depend on the cross-sectional area of current loop 318 and on the width (along direction 314) of current loop 318.

FIG. 3C illustrates a top view (i.e., a view along direction 316) of the structure shown in FIG. 3A in accordance with some embodiments described in this disclosure.

Current loop 320 is formed by a current that flows between the first set of contacts and the second set of contacts via conductors 308 and 306. Current loop 320 also contributes an inductance to the power distribution network.

Figure 1:
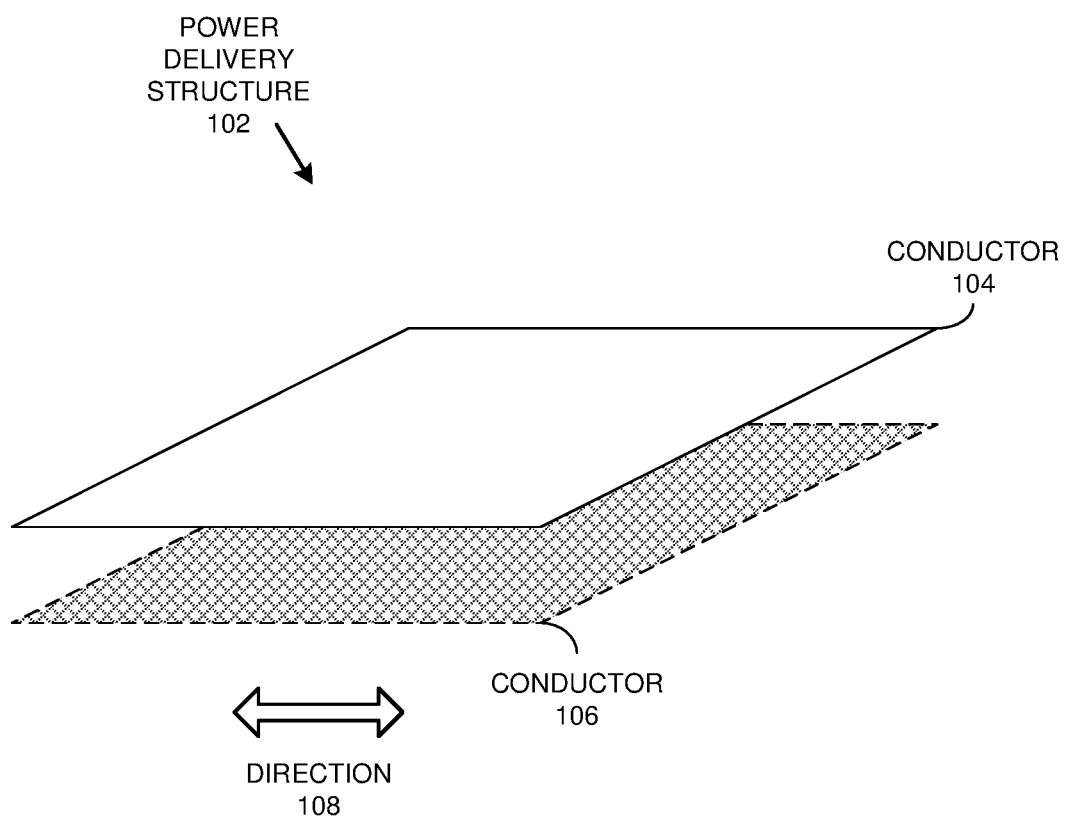
FIG. 1 illustrates a structure for delivering power.

The inductances contributed by current loops 318 and 320 are coupled in parallel. Therefore, the effective inductance of these two loops is less than the individual inductances of either of the two loops. This effective inductance can be less than the inductance of a corresponding structure that does not have interdigitated conductors, e.g., a structure similar to the one shown in FIG. 1. In some embodiments, the structure illustrated in FIG. 3A can be more effective in reducing the overall inductance of the power distribution network when the distance between the two layers (e.g., the distance between interdigitated conductors 310 and conducting structure 312) is large and/or the distance between adjacent conductors in the set of interdigitated conductors (e.g., interdigitated conductors 310) is small.

Various modifications to the disclosed embodiments will be readily apparent to those skilled in the art, and the general principles defined herein may be applied to other embodiments and applications without departing from the spirit and scope of the present disclosure. Some variations and modifications of the embodiment illustrated in FIG. 3A are described below.

Figure 4A:
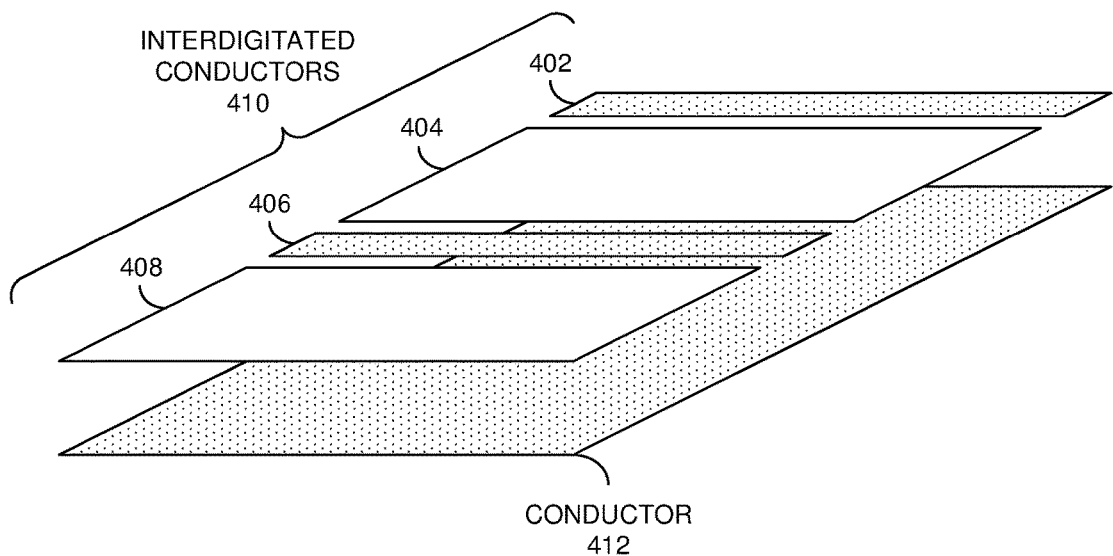
FIG. 4A illustrates a structure for delivering power in accordance with some embodiments described in this disclosure.

FIG. 4A illustrates a structure for delivering power in accordance with some embodiments described in this disclosure.

The structure shown in FIG. 4A comprises conductors disposed on two or more layers. Specifically, the structure comprises interdigitated conductors 410 disposed on a first layer, and a monolithic conductor 412 disposed on a second layer.

In some embodiments, interdigitated conductors 410 can include conductors 402-408. At least one conductor (e.g., conductors 402 and 406) in interdigitated conductors 410 can be maintained at voltage V1, and at least one conductor (e.g., conductors 404 and 408) in interdigitated conductors 410 can be maintained at voltage V2, wherein voltage V1 is different from voltage V2. In general, voltages V1 and V2 can be any voltages that can be used to provide power to a circuit. Specifically, in some embodiments, voltage V1 can be ground and voltage V2 can be a power supply voltage. In other embodiments, voltage V1 can be a power supply voltage and voltage V2 can be ground.

In some embodiments, conductor 412 can be maintained at the same voltage as conductors 402 and 406, i.e., voltage V1. In some embodiments, conductor 412 can be maintained at voltage V2.

In some embodiments (as shown in FIG. 4A), conductors 402 and 406 can have smaller widths than conductors 404 and 408. In some embodiments, conductors 402 and 406 can have the same widths as conductors 404 and 408.

The inductance of the structure shown in FIG. 4A can be less than the inductance of a structure in which conductors 402 and 406 have the same widths as conductors 404 and 408. The inductance of a structure in which conductors 402 and 406 have the same widths as conductors 404 and 408 can be less than the inductance of a structure that does not include interdigitated conductors (e.g., a structure similar to the one shown in FIG. 1).

Figure 4B:
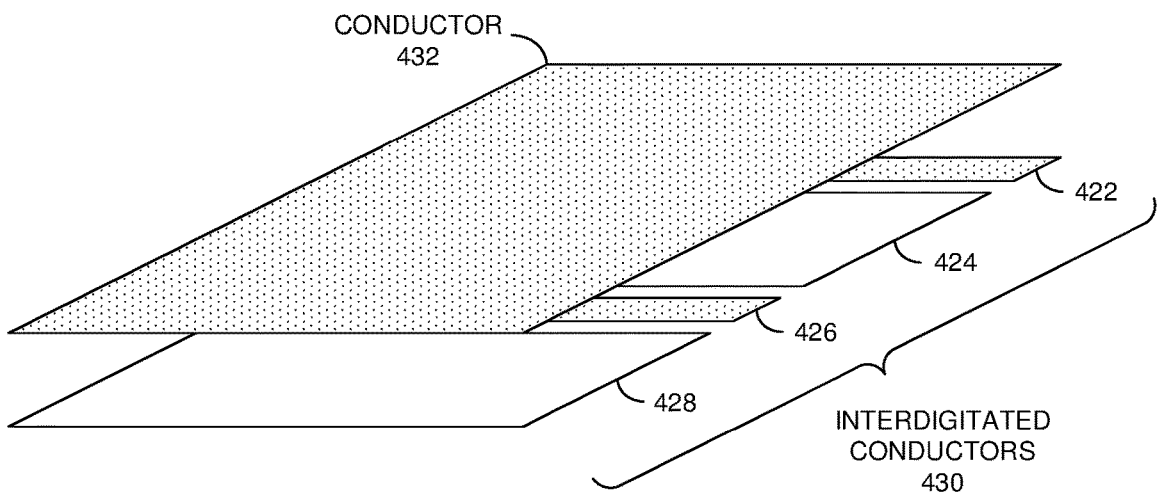
FIG. 4B illustrates a structure for delivering power in accordance with some embodiments described in this disclosure.

FIG. 4B illustrates a structure for delivering power in accordance with some embodiments described in this disclosure.

The structure shown in FIG. 4B is a variation of the structure shown in FIG. 4A. Both of these structures comprise conductors disposed on two or more layers. However, unlike FIG. 4A, interdigitated conductors 430 (which include conductors 422-428) are disposed on a lower layer, and monolithic conductor 432 is disposed on an upper layer.

Figure 5A:
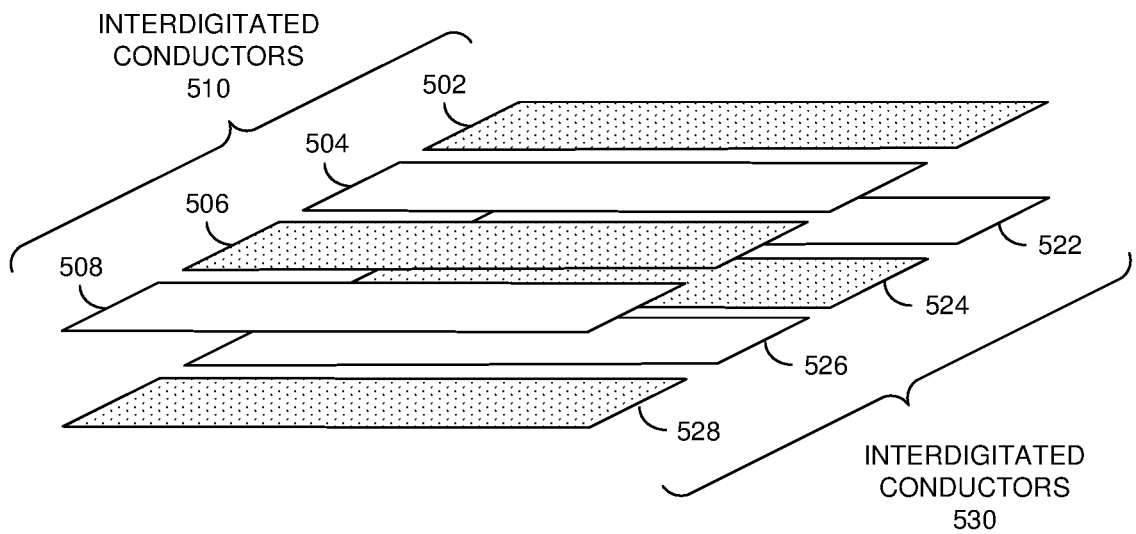
FIG. 5A illustrates a structure for delivering power in accordance with some embodiments described in this disclosure.

FIG. 5A illustrates a structure for delivering power in accordance with some embodiments described in this disclosure.

The structure shown in FIG. 5A comprises conductors disposed on two or more layers. Specifically, the structure comprises interdigitated conductors 510 disposed on a first layer, and interdigitated conductors 530 disposed on a second layer.

Interdigitated conductors 510 can include conductors 502-508, and interdigitated conductors 530 can include conductors 522-528. At least one conductor (e.g., conductors 502 and 506) in interdigitated conductors 510 can be maintained at voltage V1, and at least one conductor (e.g., conductors 504 and 508) in interdigitated conductors 510 can be maintained at voltage V2. Further, at least one conductor (e.g., conductors 524 and 528) in interdigitated conductors 530 can be maintained at voltage V1, and at least one conductor (e.g., conductors 522 and 526) in interdigitated conductors 510 can be maintained at voltage V2.

Voltages V1 and V2 are different from one another, and can generally be any set of voltages that can be used to provide power to a circuit. Specifically, in some embodiments, voltage V1 can be ground and voltage V2 can be a power supply voltage. In other embodiments, voltage V1 can be a power supply voltage and voltage V2 can be ground.

In FIG. 5A, the voltage of a conductor in a layer (e.g., conductor 506 in the upper layer) is different from the voltages of adjacent conductors in the same layer (e.g., conductors 504 and 508 in the upper layer), and is also different from the voltage of the corresponding conductor in the other layer (e.g., conductor 526 in the lower layer).

In FIG. 5A, conductors 502-508 and 522-528 are shown as having substantially the same widths. However, in other embodiments, the conductors may have different widths.

Figure 5B:
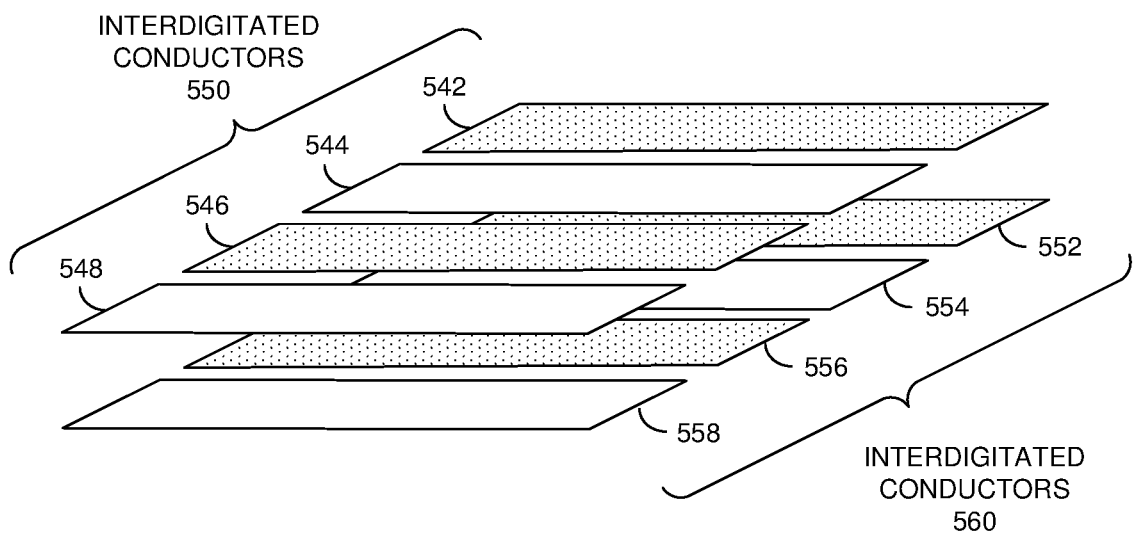
FIG. 5B illustrates a structure for delivering power in accordance with some embodiments described in this disclosure.

FIG. 5B illustrates a structure for delivering power in accordance with some embodiments described in this disclosure.

The structure shown in FIG. 5B is a variation of the structure shown in FIG. 5A. Both of these structures comprise interdigitated conductors disposed on two or more layers. Specifically, interdigitated conductors 550 (which include conductors 542-548) are disposed on an upper layer, and interdigitated conductors 560 (which include conductors 552-558) are disposed on a lower layer. Furthermore, as in FIG. 5A, the voltage of a conductor in a layer (e.g., conductor 546) is different from the voltages of adjacent conductors in the same layer (e.g., conductors 544 and 548). However, unlike FIG. 5A, the voltage of a conductor in a layer (e.g., conductor 546 in the upper layer) is the same as the voltage of the corresponding conductor in the other layer (e.g., conductor 556 in the lower layer). Although the conductors in FIG. 5B are shown as having substantially the same widths, the conductors can have different widths in other embodiments.

Figure 6A:
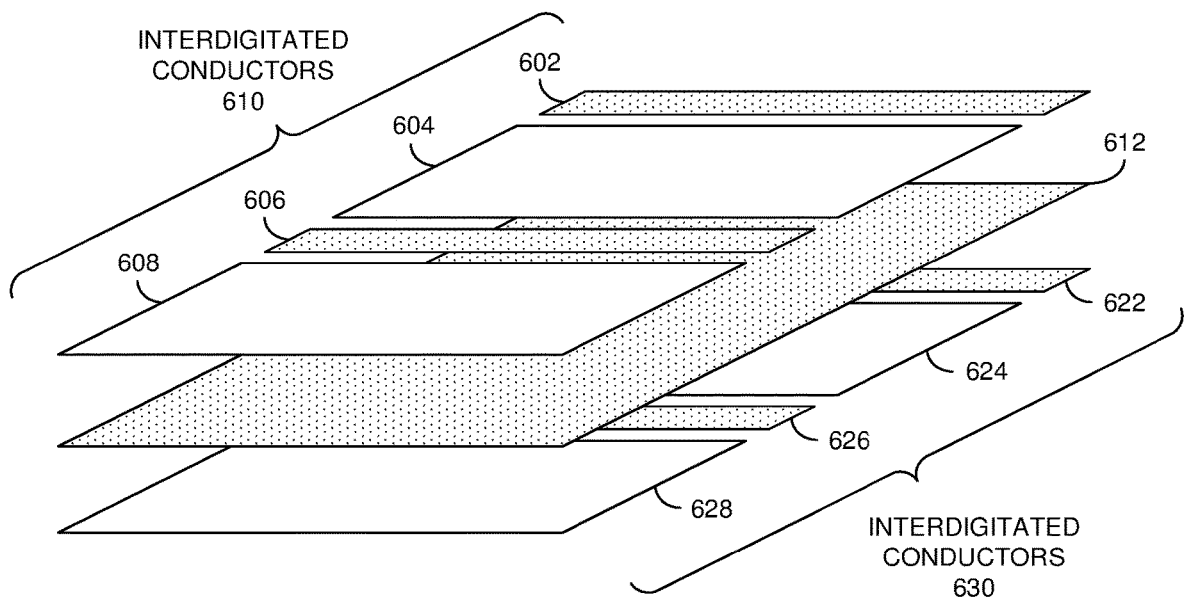
FIG. 6A illustrates a structure for delivering power in accordance with some embodiments described in this disclosure.

FIG. 6A illustrates a structure for delivering power in accordance with some embodiments described in this disclosure.

The structure shown in FIG. 6A comprises conductors disposed on three or more layers. Specifically, the structure comprises interdigitated conductors 610 (which include conductors 602-608) disposed on a first layer, monolithic conductor 612 disposed on a second layer, and interdigitated conductors 630 (which include conductors 622-628) disposed on a third layer.

At least one conductor (e.g., conductors 602 and 606) in interdigitated conductors 610 can be maintained at voltage V1, and at least one conductor (e.g., conductors 604 and 608) in interdigitated conductors 610 can be maintained at voltage V2. Similarly, at least one conductor (e.g., conductors 622 and 626) in interdigitated conductors 630 can be maintained at voltage V1, and at least one conductor (e.g., conductors 624 and 628) in interdigitated conductors 630 can be maintained at voltage V2. In some embodiments, conductor 612 can be maintained at voltage V1, and in other embodiments, conductor 612 can be maintained at voltage V2.

Voltages V1 and V2 are different from one another, and can generally be any set of voltages that can be used to provide power to a circuit. Specifically, in some embodiments, voltage V1 can be ground and voltage V2 can be a power supply voltage. In other embodiments, voltage V1 can be a power supply voltage and voltage V2 can be ground.

In FIG. 6A, conductors 602, 606, 622, and 626 are shown as having smaller widths than conductors 604, 608, 624, and 628. In other embodiments, the conductors may have the same widths. The inductance of the structure shown in FIG. 6A may be less than the inductance of a structure in which conductors have the same widths.

Figure 6B:
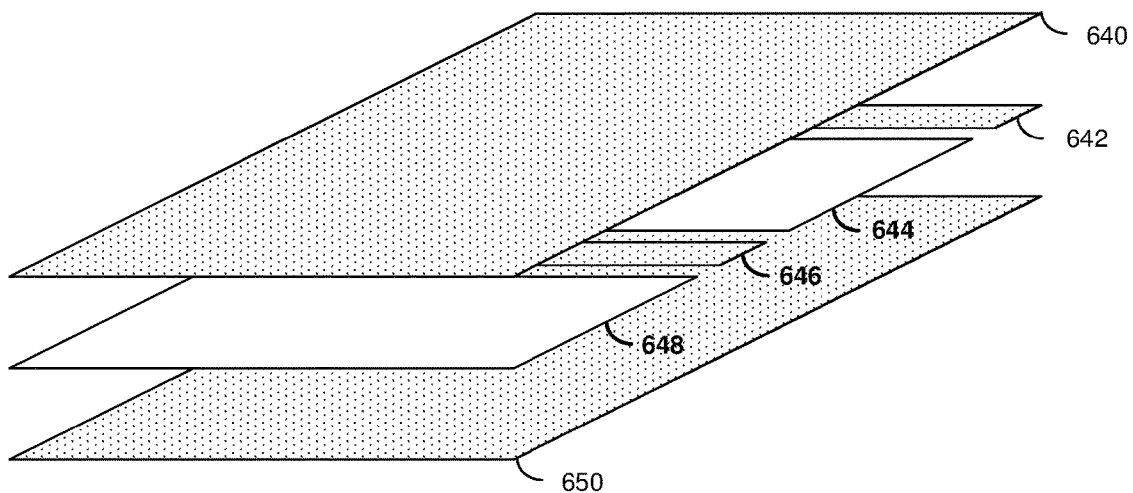
FIG. 6B illustrates a structure for delivering power in accordance with some embodiments described in this disclosure.

FIG. 6B illustrates a structure for delivering power in accordance with some embodiments described in this disclosure.

The structure shown in FIG. 6B is a variation of the structure shown in FIG. 6A. Both of these structures comprise conductors disposed on three or more layers. Specifically, the structure shown in FIG. 6B comprises monolithic conductor 640 disposed on a first layer, a set of interdigitated conductors that include conductors 642-648 disposed on a second layer, and monolithic conductor 650 disposed on a third layer.

At least one conductor (e.g., conductors 642 and 646) in the set of interdigitated conductors can be maintained at voltage V1, and at least one conductor (e.g., conductors 644 and 648) in the set of interdigitated conductors can be maintained at voltage V2. Monolithic conductors 640 and 650 can be maintained at voltage V1 or V2.

Figure 7:
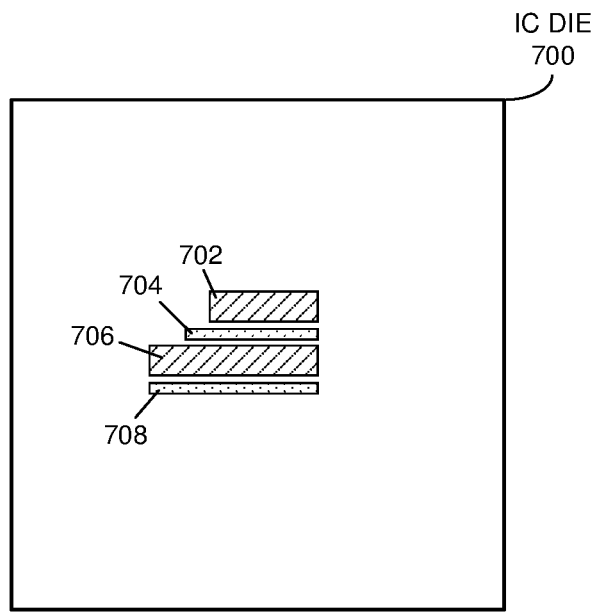
FIG. 7 illustrates a structure for delivering power that is part of a power distribution network in an IC die in accordance with some embodiments described in this disclosure.

FIG. 7 illustrates a structure for delivering power that is part of a power distribution network in an IC die in accordance with some embodiments described in this disclosure.

IC die 700 can include a power distribution network that supplies power to various circuit elements in the IC die. The power distribution network can include conductors disposed on two or more metal layers, including a set of interdigitated conductors 702-708 disposed on one of the metal layers. The conductors can be oriented substantially along an expected direction of current flow, and may or may not have the same dimensions and/or shapes. Adjacent conductors in the set of interdigitated conductors 702-708 can have different voltages. For example, conductors 702 and 706 may be maintained at voltage V1 and conductors 704 and 708 may be maintained at voltage V2. Voltages V1 and V2 can generally be any pair of voltages that are capable of being used to deliver power to a circuit. The power distribution network may also include other conducting structures (not shown) that are disposed on other metal layers of the IC die.

Figure 8:
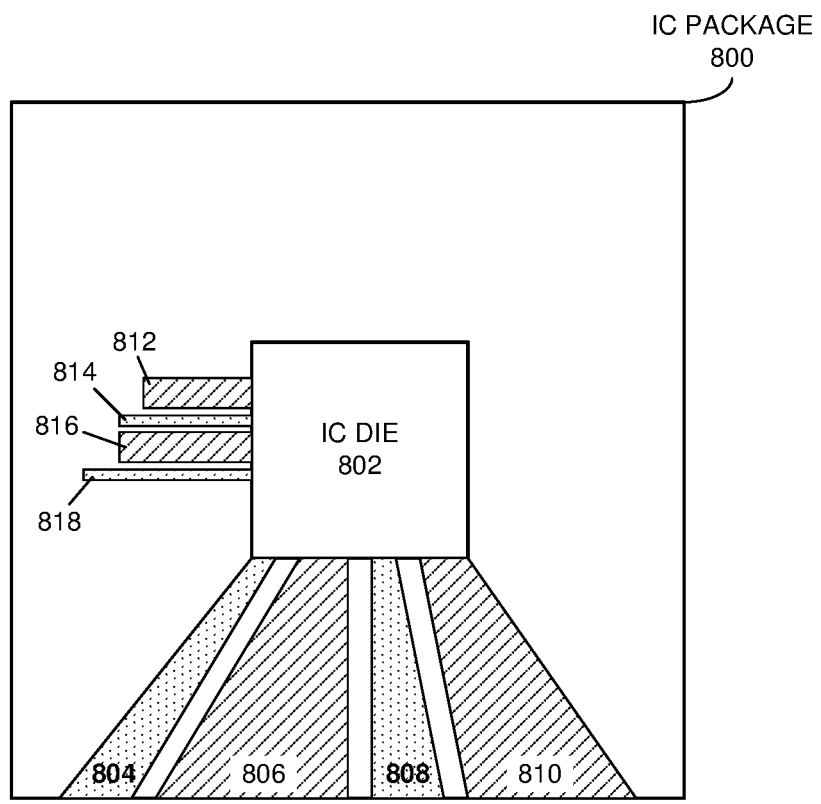
FIG. 8 illustrates a structure for delivering power that is part of a power distribution network in an IC package in accordance with some embodiments described in this disclosure.

FIG. 8 illustrates a structure for delivering power that is part of a power distribution network in an IC package in accordance with some embodiments described in this disclosure.

IC package 800 can include a power distribution network that supplies power to die 802. The power distribution network can include conductors disposed on two or more layers, including a set of interdigitated conductors 804-818 disposed on a first layer. Conductors 804-810 are trapezoidal, and are oriented substantially along the expected direction of current flow. Conductors 812-818 are rectangular and are oriented substantially along the expected direction of current flow. Conductors 812-818 do not extend to an edge of IC package 800, and have different lengths. Adjacent conductors in the set of interdigitated conductors 804-818 can have different voltages. For example, conductors 804 and 808 may be maintained at voltage V1 and conductors 806 and 810 may be maintained at voltage V2. Similarly, conductors 814 and 818 may be maintained at voltage V3 (which may or may not be the same as voltage V1) and conductors 812 and 816 may be maintained at voltage V4 (which may or may not be the same as voltage V2). The power distribution network may also include other conducting structures (not shown) that are disposed on other layers.

Figure 9:
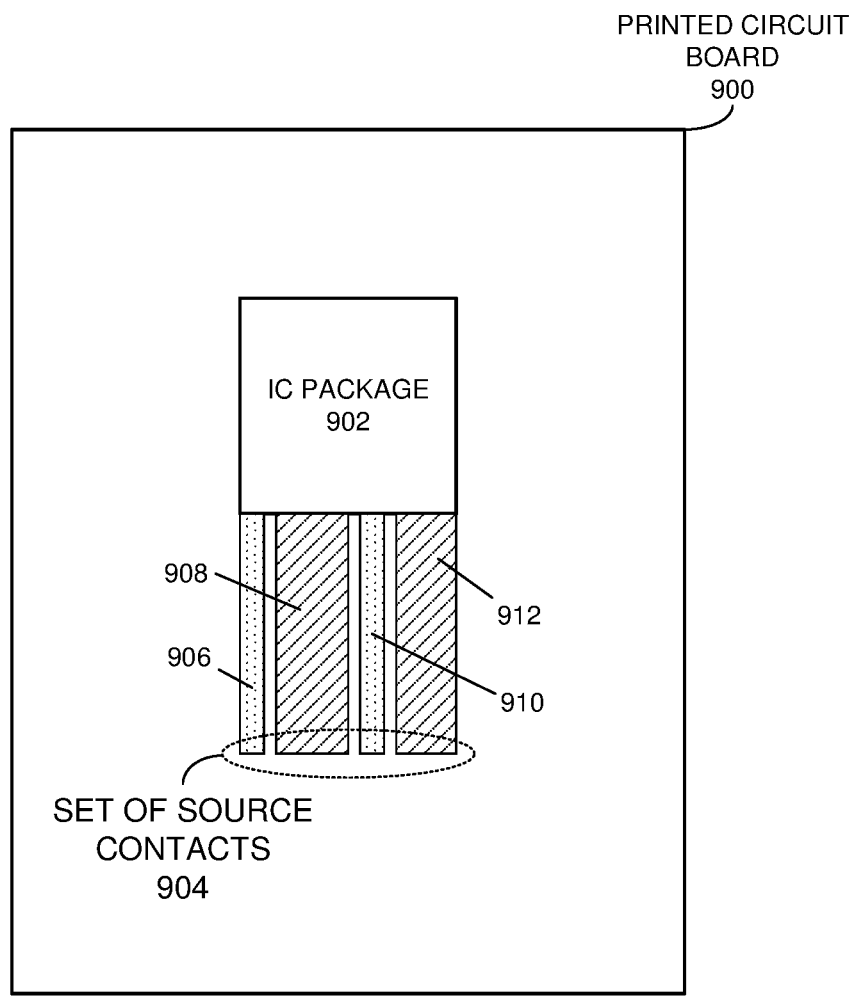
FIG. 9 illustrates a structure for delivering power that is part of a power distribution network in a printed circuit board in accordance with some embodiments described in this disclosure.

FIG. 9 illustrates a structure for delivering power that is part of a power distribution network in a printed circuit board in accordance with some embodiments described in this disclosure.

Printed circuit board 900 can include a power distribution network that supplies power from set of contacts 904 to IC package 902. The power distribution network can include conductors disposed on two or more layers, including a set of interdigitated conductors 906-912 disposed on a first layer. As shown in FIG. 9, conductors 906-912 can be rectangular in shape, and can be oriented substantially along the expected direction of current flow, namely, between set of contacts 904 and IC package 902. Further, adjacent conductors in the set of interdigitated conductors 906-912 can have different voltages. For example, conductors 906 and 910 may be maintained at voltage V1 and conductors 908 and 912 may be maintained at voltage V2. The power distribution network may also include other conducting structures (not shown) that are disposed on other layers.

In some embodiments, IC die 700, and IC packages 800 and 902 can include memory devices. Examples of memory devices include, but are not limited to, static random access memory devices, dynamic random access memory (DRAM) devices such as synchronous double data rate (DDR) DRAM, and non-volatile memory devices such as Flash memory devices.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. A structure for delivering power, comprising:
a first set of conductors disposed on a first layer, wherein a voltage of each conductor of the first set of conductors is maintained at a first voltage or a second voltage such that adjacent conductors of the first set of conductors are maintained at different voltages;
a second set of conductors disposed on a second layer, wherein a voltage of each conductor of the second set of conductors is maintained at the first voltage or the second voltage such that adjacent conductors of the second set of conductors are maintained at different voltages; and
a third conductor disposed between the first layer and the second layer, wherein the third conductor is maintained at the first voltage or the second voltage.

2. The structure of claim 1, wherein the first voltage is ground and the second voltage is a power supply voltage.

3. The structure of claim 1, wherein the first voltage is a power supply voltage and the second voltage is ground.

4. The structure of claim 1, wherein adjacent conductors of the first set of conductors have different widths.

5. The structure of claim 1, wherein adjacent conductors of the second set of conductors have different widths.

6. The structure of claim 1, wherein the structure is part of a power distribution network in an integrated circuit die.

7. The structure of claim 1, wherein the structure is part of a power distribution network in an integrated circuit package.

8. The structure of claim 1, wherein the structure is part of a power distribution network in a printed circuit board.

9. Circuitry for delivering power, comprising:
a first set of interdigitated conductors disposed on a first layer;
a second set of interdigitated conductors disposed on a second layer;
a third conductor disposed between the first layer and the second layer;
wherein the first set of interdigitated conductors and the second set of interdigitated conductors are substantially aligned along a first direction such that each conductor of the first set of interdigitated conductors is opposed to a corresponding conductor of the second set of interdigitated conductors along the first direction; and
wherein a voltage of each conductor of the first set of interdigitated conductors is maintained at a first voltage or a second voltage such that adjacent conductors of the first set of interdigitated conductors are maintained at different voltages.

10. The circuitry of claim 9, wherein the first voltage is ground and the second voltage is a power supply voltage.

11. The circuitry of claim 9, wherein the first voltage is a power supply voltage and the second voltage is ground.

12. The circuitry of claim 9, wherein adjacent conductors of the first set of conductors have different widths.

13. The circuitry of claim 9, wherein adjacent conductors of the second set of conductors have different widths.

14. The circuitry of claim 9, wherein the circuitry is part of a power distribution network in an integrated circuit die.

15. The circuitry of claim 9, wherein the circuitry is part of a power distribution network in an integrated circuit package.

16. The circuitry of claim 9, wherein the circuitry is part of a power distribution network in a printed circuit board.

17. A method, comprising:
   disposing a first set of conductors on a first layer and a second set of conductors on a second layer such that the first set of conductors and the second set of conductors are substantially aligned along a first direction and each conductor of the first set of conductors is opposed to a corresponding conductor of the second set of conductors along the first direction;
   disposing a third conductor between the first layer and the second layer;
   maintaining adjacent conductors of the first set of conductors at different voltages, the different voltages being selected from a first voltage and a second voltage;
   maintaining adjacent conductors of the second set of conductors at different voltages, the different voltages being selected from the first voltage and the second voltage; and
   maintaining the third conductor at the first voltage or the second voltage.

18. The method of claim 17, wherein adjacent conductors of the first set of conductors have different widths and adjacent conductors of the second set of conductors have different widths.

19. The method of claim 17, wherein the first voltage is ground and the second voltage is a power supply voltage.

20. The method of claim 17, wherein the first voltage is a power supply voltage and the second voltage is ground.

* * * * *